United States Patent
Shimizu et al.

(10) Patent No.: US 9,234,280 B2
(45) Date of Patent: Jan. 12, 2016

(54) EPITAXIAL GROWTH APPARATUS AND EPITAXIAL GROWTH METHOD

(75) Inventors: Akihiko Shimizu, Tokyo (JP);
Fumihiko Kimura, Nagasaki (JP);
Takeshi Masuda, Nagasaki (JP)

(73) Assignee: SUMCO Corporation, Tokyo (JP)

(*) Notice: Subject to any disclaimer, the term of this patent is extended or adjusted under 35 U.S.C. 154(b) by 697 days.

(21) Appl. No.: 13/445,037

(22) Filed: Apr. 12, 2012

(65) Prior Publication Data
US 2012/0285382 A1 Nov. 15, 2012

(30) Foreign Application Priority Data
May 13, 2011 (JP) ................................ 2011-108432

(51) Int. Cl.
*C23C 16/00* (2006.01)
*C23C 16/458* (2006.01)
*H01L 21/687* (2006.01)
*C30B 25/12* (2006.01)

(52) U.S. Cl.
CPC ............ *C23C 16/4584* (2013.01); *C30B 25/12* (2013.01); *H01L 21/6875* (2013.01); *H01L 21/68785* (2013.01)

(58) Field of Classification Search
CPC .................. H01L 21/68792; H01L 21/68721; H01L 21/68728; H01L 21/68735; H01L 21/6875; H01L 21/67383; H01L 21/68785
See application file for complete search history.

(56) References Cited

U.S. PATENT DOCUMENTS

| | | | | |
|---|---|---|---|---|
| 5,044,943 A | * | 9/1991 | Bowman et al. | 432/121 |
| 6,113,702 A | * | 9/2000 | Halpin et al. | 118/725 |
| 6,345,150 B1 | * | 2/2002 | Yoo | 392/418 |
| 6,375,749 B1 | * | 4/2002 | Boydston et al. | 118/728 |
| 2005/0039685 A1 | * | 2/2005 | Eiriksson et al. | 118/728 |
| 2008/0069951 A1 | * | 3/2008 | Chacin et al. | 427/248.1 |
| 2013/0320636 A1 | * | 12/2013 | Ogawa et al. | 279/110 |

FOREIGN PATENT DOCUMENTS

JP     2000124141 A   *   4/2000   ............ H01L 21/205

OTHER PUBLICATIONS

English Translation JP 2000124141.*

* cited by examiner

*Primary Examiner* — Gordon R Baldwin
*Assistant Examiner* — Charlee Bennett
(74) *Attorney, Agent, or Firm* — Thomas J. Engellenner; Reza Mollaaghababa; Pepper Hamilton LLP

(57) ABSTRACT

A susceptor support shaft for an epitaxial growth apparatus capable of forming a high quality epitaxial film by suppressing in-plane resistance variation of the epitaxial film due to deflection of a susceptor, wherein the susceptor support shaft supports a susceptor at an underneath portion of the susceptor in an epitaxial growth apparatus. The susceptor support shaft includes a support column located substantially coaxial with a center of the susceptor; a plurality of arms extending radially from the support column to positions under a peripheral portion of the susceptor; an arm connecting member connecting tips of the arms next to each other; and support pins extending from the arm connecting member, thereby supporting the susceptor.

5 Claims, 6 Drawing Sheets

(a)

(b)

(c)

EPITAXIAL GROWTH APPARATUS AND EPITAXIAL GROWTH METHOD

BACKGROUND OF THE INVENTION

1. Field of the Invention

The present invention relates to a susceptor support shaft for epitaxial growth apparatuses and an epitaxial growth apparatus. The present invention relates in particular to improvement of a susceptor support shaft for supporting a susceptor on which a semiconductor wafer is placed during growth of an epitaxial film on the semiconductor wafer.

2. Description of the Related Art

In the field of semiconductor electronics in which products are increasingly required to achieve high performances and to have high functionality, quality of an epitaxial wafer significantly influences the quality of a resulting product device. An epitaxial wafer is formed by growing an epitaxial film on a surface of a semiconductor wafer by vapor phase epitaxy. The epitaxial film formed is of high quality in that it has crystal axes aligned in accordance with atoms regularly oriented in the surface of the semiconductor wafer.

For production of such epitaxial wafers, batch-process-type epitaxial growth apparatuses capable of simultaneously performing epitaxial growth on a plurality of semiconductor wafers have been conventionally used. However, such batch-process-type epitaxial growth apparatuses as described above are unsuitable for production of large-diameter semiconductor wafers. For this reason, in recent years, it has been common to use single-wafer epitaxial growth apparatuses in which individual semiconductor wafers are separately subjected to epitaxial growth. Recently, there have been developed single-wafer epitaxial growth apparatuses for large-diameter semiconductor wafers, capable of processing semiconductor wafers having a diameter of 450 mm or more.

FIG. 1 is a schematic sectional view of a conventional single-wafer epitaxial growth apparatus 200. This epitaxial growth apparatus 200 includes a chamber 201, a susceptor 202 for supporting a wafer W placed inside the chamber 201, and a susceptor support shaft 203 for supporting the susceptor 202. A supply port 204 for process gases is formed at a side portion of the chamber 201, and an exhaust port 205 is formed at a position of the chamber opposite to the supply port 204. Further, a plurality of halogen lamps 206 as heating sources are radially disposed in each of an upper region and a lower region of the chamber 201.

FIG. 2 is a schematic exploded perspective view showing details of the susceptor 202 and the susceptor support shaft 203. The susceptor support shaft 203 includes a support column 207 and three arms 208, and each of the arms 208 is provided with a support pin 210 for supporting the susceptor 202. Further, recessed portions 211 are separately formed on the rear surface of the susceptor 202 at positions corresponding to the respective support pins 210. The recessed portions 211 are engaged with the support pins 210 of the arms 208, so that the susceptor 202 is positioned with respect to the susceptor support shaft 203. As described above, the conventional susceptor support shaft 203 generally supports the susceptor 202 at three points using the three support pins 210 provided on the three arms (See JP 2000-124141A).

In the epitaxial growth apparatus 200, the semiconductor wafer W is placed on the susceptor 202; the halogen lamps 206 are lit to heat the semiconductor wafer W; and at the same time, a carrier gas, a growth source gas, a dopant gas, and the like are introduced as process gases from the supply port 204, such that the process gases flow in a laminar flow state along a surface of the semiconductor wafer W which has been heated to a predetermined temperature while an exhaust gas is discharged from the exhaust port 205. At this point, in order to uniformly form an epitaxial film on the entire surface of the semiconductor wafer W, the susceptor support shaft 203 is rotated around the support column 207 as a central axis to rotate the susceptor 202 and the semiconductor wafer W. Thus, an epitaxial film can be grown on the semiconductor wafer W by the epitaxial growth apparatus 200.

However, when an epitaxial film is formed by the above conventional method, in-plane resistivity of the epitaxial film greatly varies. In response to this, the inventors of the present invention earnestly studied to make resistivity distribution of an epitaxial film uniform, and consequently found that, even in a case where the susceptor 202 is uniformly heated, the peripheral portion of the susceptor 202 is deflected (in the circumferential direction) due to exposure of the susceptor 202 itself to the high-temperature environment and that a magnitude of such deflection of the susceptor 202 as described is especially large at portions not supported by the susceptor support shaft 203.

In a case where the epitaxial growth process is carried out in a state where the susceptor 202 has partially been deflected at the peripheral portion thereof, a space is created between the deflected portion of the susceptor 202 and a semiconductor wafer W placed thereon. A carrier gas or the like entering into the space partially cools the semiconductor wafer W and the temperature of the semiconductor wafer W varies in the circumferential direction thereof. When epitaxial growth is performed on such a surface of the semiconductor wafer W where the temperature varies as described above, the amount of dopant taken into the epitaxial layer grown on the wafer surface would also vary in the wafer plane. In short, deflection of the susceptor 202 significantly affects the resistivity distribution of the silicon epitaxial film in the epitaxial wafer. This problem of non-uniform resistivity distribution cannot be ignored in an epitaxial wafer to which the resistivity standards must be strictly applied.

In view of the above, the inventors thought of and studied performing of epitaxial growth in a state where in-plane temperature variation of a semiconductor wafer due to deflection of a susceptor is suppressed by increasing the numbers of arms and support pins to support a susceptor at more points. Consequently, they found that resistivity distribution of an epitaxial film could be made uniform by increasing the numbers of arms and support pins to support a susceptor at more points. However, they found another problem in that increased number of arms would make the arms interrupt between a surface on the rear side of a susceptor and a pyrometer, which would make it impossible to detect accurate temperature of the surface on the rear side of the susceptor using the pyrometer. When accuracy in detecting the temperature of the surface on the rear side of the susceptor is reduced, the power of lower halogen lamps 206 cannot be controlled accurately, which would result in reduced quality of the epitaxial wafer. Further, it is found that accuracy in detecting the temperature of the surface on the rear side of the susceptor by the pyrometer tends to be reduced as the rotation speed of the susceptor is increased. To produce a flatter epitaxial wafer, the susceptor and the semiconductor wafer are required to be rotated at a higher speed. Therefore, these problems would be more significant as more attempts to produce wafers having higher flatness are made in the future.

On the other hand, if the number of arms is reduced to the original number so as not to impair the accuracy in detecting the temperature of the rear surface of a susceptor by a pyrometer, in-plane resistance variation of an epitaxial film due to deflection of the susceptor cannot be suppressed. Thus, there have been trade-offs.

SUMMARY OF THE INVENTION

Therefore, in view of the above problems, an object of the present invention is to provide a susceptor support shaft for an epitaxial growth apparatus capable of forming a high quality epitaxial film with more uniform in-plane resistivity distribution, by suppressing in-plane resistance variation of the epitaxial film due to deflection of a susceptor, while ensuring accuracy in detecting the temperature of the rear surface of the susceptor by a pyrometer.

In terms of achieving the above object, the present invention primarily includes the following constituents.

(1) A susceptor support shaft, supporting a susceptor at an underneath portion of the susceptor in an epitaxial growth apparatus for forming an epitaxial film on a surface of a semiconductor wafer placed on the susceptor, the susceptor support shaft comprising:

a support column located substantially coaxial with a center of the susceptor;

a plurality of arms extended radially from the support column to positions under a peripheral portion of the susceptor;

an arm connecting member connecting tips of the arms next to each other; and n support pins (n is a natural number of four or more) provided on the arm connecting member, thereby supporting the susceptor, wherein the number of the arms is (n−1) or less.

(2) The susceptor support shaft according to (1) above, wherein the number of the arms is three or more and five or less.

(3) The susceptor support shaft according to (1) above, wherein the number of the support pins is nine or less.

(4) The susceptor support shaft according to (1) above, wherein the number of the arms is three, and the number of the support pins is six.

(5) The susceptor support shaft according to (1) above, wherein the arm connecting member is a ring member concentric with the susceptor.

(6) An epitaxial growth apparatus for forming an epitaxial film on a surface of a semiconductor wafer placed inside a chamber, comprising a susceptor on which the semiconductor wafer is placed inside the chamber, and the susceptor support shaft according to (1) above.

A susceptor support shaft of the present invention uses at least four support pins for supporting a susceptor at an underneath portion of the susceptor, thereby suppressing in-plane resistance variation of an epitaxial film due to deflection of the susceptor. Meanwhile, the number of arms is smaller than that of support pins, thereby ensuring accuracy in detecting the temperature of the rear surface of the susceptor by a pyrometer. Thus, a high-quality epitaxial wafer with more uniform in-plane resistivity distribution can be produced.

DETAILED DESCRIPTION OF THE INVENTION

Embodiments of a susceptor support shaft and an epitaxial growth apparatus according to the present invention will be described with reference to the drawings.

(Epitaxial Growth Apparatus)

Figure 3:
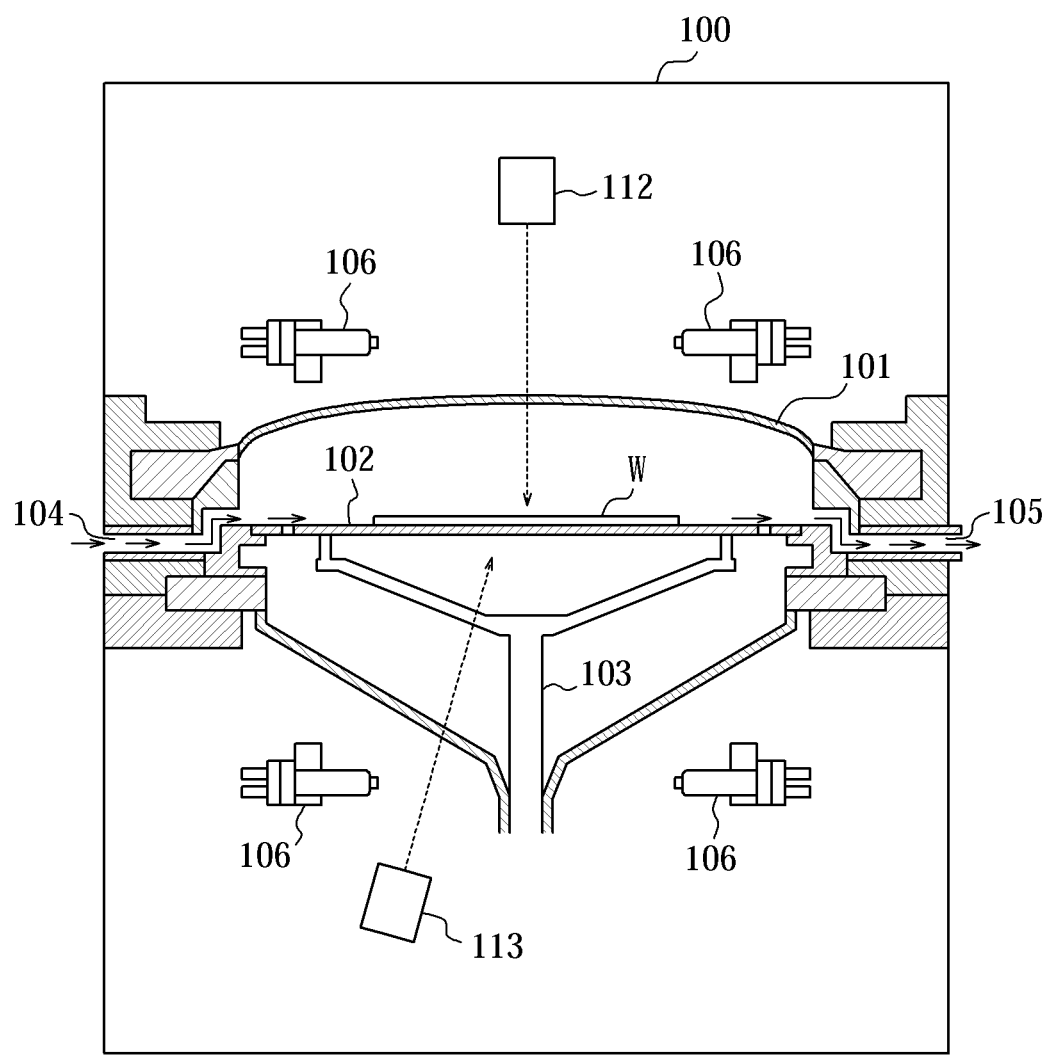
FIG. 3 is a schematic sectional view of a single-wafer epitaxial growth apparatus 100 using a susceptor support shaft 103 according to the present invention.

To form an epitaxial film on a semiconductor wafer using a susceptor support shaft of the present invention, an epitaxial growth apparatus 100 shown in FIG. 3, for example, is preferably used. The epitaxial growth apparatus 100 according to an embodiment of the present invention is an epitaxial growth apparatus for forming an epitaxial film on a semiconductor wafer W disposed inside a chamber 101 having a supply port 104 and an exhaust port 105 for process gases. The epitaxial growth apparatus 100 further has a susceptor 102 on which the semiconductor wafer W is disposed inside the chamber 101, and a susceptor support shaft 103 according to the embodiment of the present invention for supporting the susceptor 102 at an underneath portion of the susceptor 102.

It is preferable that a base material of the susceptor 102 is graphite and a surface thereof is coated with silicon carbide. Although graphite is excellent in thermal conductivity, heat resistance, and strength, it contains occluded gas therein due to porosity thereof to be less pure. Therefore, it is preferable to employ a structure in which the surface of the susceptor 102 is coated with silicon carbide. Further, it is preferable to set the thickness of the susceptor 102 to the range of 20 mm to 40 mm. Although a thicker susceptor is more effective in preventing deflection, an excessively thick susceptor has relatively large heat capacity, inevitably increasing time for the susceptor 102 to be heated to a predetermined temperature, which is not preferable. In a case where the susceptor is too thin, difference in the amount of heat released is conspicuous between the center portion and the outer peripheral portion of the susceptor 102, which is not preferable either, because the temperature varies significantly in the radial direction and the magnitude of deflection increases. A counter bore (not shown) for accommodating the semiconductor wafer when the wafer is placed thereon is formed on the surface of the susceptor 102.

It is preferable that the susceptor support shaft 103 is made of quartz, especially of synthetic quartz. Quartz is excellent in heat resistance and purity, and easily transmits radiation from an infrared lamp, so that the susceptor 102 can be uniformly heated. The detailed structure of the susceptor support shaft 103 will be described later.

Heating sources 106 are provided in an upper region and a lower region of the chamber 101. In general, halogen lamps or infrared lamps, which have fast rising-and-falling temperature rates and good temperature controllability is preferably used as the heating sources 106.

An upper pyrometer 112 and a lower pyrometer 113 are placed in the upper region and the lower region of the chamber 101, respectively. The upper pyrometer 112 detects the temperature of a surface of the semiconductor wafer W to be processed, while the lower pyrometer 113 detects the temperature of the rear surface of the susceptor 102. The output of the heating sources 106 is adjusted using a power controller not shown, by correcting the difference between target temperatures and the temperatures detected by the pyrometers. Further, the lower pyrometer 113 and the susceptor support shaft 103 are positioned such that arms 108 pass between the lower pyrometer 113 and the rear surface of the susceptor 102 with the rotation of the susceptor support shaft 103.

After the semiconductor wafer W is placed on the susceptor 102 inside the epitaxial growth apparatus 100, the heating sources 106 are lit to heat the semiconductor wafer W. At the same time, a gas such as trichlorosilane ($SiHCl_3$) gas or dichlorosilane ($SiH_2Cl_2$) gas is introduced as a process gas from the supply port 104 into the chamber, while an exhaust gas is exhausted from the exhaust port 105. Then, the process gas flows in a laminar flow state along the surface of the semiconductor W, which has been heated to a predetermined temperature; thus, a semiconductor of silicon epitaxially grows on the semiconductor wafer W.

(Susceptor Support Shaft)

The susceptor support shaft 103 which is an embodiment of the present invention supports a susceptor 102 at an underneath portion of the susceptor 102 in an epitaxial growth apparatus 100 for forming an epitaxial film on a surface of a semiconductor wafer W placed on the susceptor 102. The susceptor support shaft 103 includes a support column 107 located substantially coaxial with the center of the susceptor 102, a plurality of arms 108 extending radially from the support column 107 to positions under a peripheral portion of the susceptor 102, an arm connecting member 109 for connecting tips of the neighboring arms 108, and n support pins 110 (n is a natural number greater than 4, n=6 in FIG. 4) which extend from the arm connecting member 109 and support the susceptor 102. The susceptor support shaft 103 is characterized in that the number of the arms 108 is (n−1) or less (five or less when n=6, and three in FIG. 4). In other words, the structure of the susceptor support shaft 103 according to this embodiment is characterized in that the number of the support pins 110 for supporting the susceptor 102 is four or more, and the number of arms 108 is less than the number of the support pins. This structure is realized by providing the arm connecting member 109 on the susceptor support shaft 103.

The technical meaning of employing the characteristic structure of the present invention will be described with the operation and effect.

According to this embodiment, four or more support pins 110 are provided, and the susceptor 102 is supported at four or more points. Therefore, as compared with cases where a susceptor is supported at three points as is conventional, variation in the temperature of the semiconductor wafer W due to deflection of the susceptor 102 can be suppressed. As a result, a high-quality epitaxial film ensuring uniformity in in-plane resistance distribution of the epitaxial film can be formed.

On the other hand, when the number of arms 108 is not increased in accordance with the increase in the number of the support pins 110, specifically when the number of arms 108 is (n−1) or less; the frequency at which the arms 108 interrupt between the lower pyrometer 113 and the rear surface of the susceptor 102 is reduced, and the accuracy in detecting the temperature of the rear surface of the susceptor 102 with the lower pyrometer 113 is ensured, as compared with the case of providing n arms 108, n being equal to the number of the support pins 110. Accordingly, epitaxial growth is performed at a temperature close to a set temperature, which allows a high-quality epitaxial film to be formed.

The number of arms 108 is preferably three or more and five or less. Less than three arms would result in strength insufficient for stably supporting the susceptors 102 in a horizontal state, while more than five arms would make it impossible to ensure sufficient accuracy in detecting the temperature of the rear surface of the susceptor 102 by the lower pyrometer 113. For this reason, in terms of not reducing the accuracy in detecting the temperature of the rear surface of the susceptor 102, the number of the arms 108 is three in the best embodiment. The rotation speed of the susceptor support shaft 103 is generally adjusted to the range of 20 rpm to 80 rpm; however, as described above, the rotation speed of the susceptor support shaft 103 in epitaxial growth needs to be increased to enhance the flatness of the epitaxial film. From this point of view, the susceptor support shaft 103 is rotated at a speed of preferably 40 rpm or more, more preferably 50 rpm to 70 rpm. For ensuring sufficient accuracy in detecting the temperature by the lower pyrometer at this rotation speed, the number of the arms 108 is still more preferably three. Further, in terms of evening up the frequency at which the arms 108 interrupt between the lower pyrometer and the susceptor 102, and in terms of applying a uniform load on the susceptor 102, the arms are preferably provided at even intervals.

Figure 6:
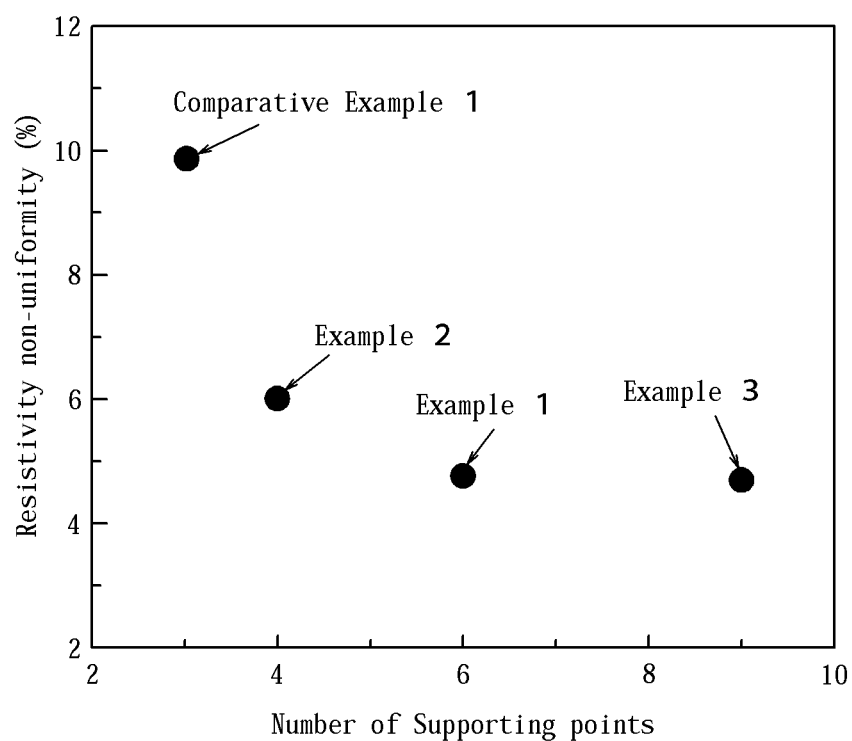
FIG. 6 is a graph plotting calculation results of the resistivity non-uniformity.

The number of support pins 110 is preferably nine or less. This is because more than nine support pins 11 would make it difficult to align the support pins 110 for supporting the susceptor 102 on a plane at the same height. The number of the support pins 110 is more preferably six. As shown in FIG. 6, when the number of the support pins 110 is more than six, non-uniformity of the epitaxial film becomes almost fixed, so that six support pins 110 can provide sufficient effects of the present invention. Further, the support pins 110 are preferably disposed at even intervals. Evenly supporting the peripheral portion of the susceptor 102 allows deflection of the susceptor 102 to be efficiently and effectively suppressed.

(Embodiment of Arm Connecting Member)

The arm connecting member 109 is not limited in particular as long as it can connect together the tips of the plurality of neighboring arms 108 extending radially from the support column 107 to the positions under the peripheral portion of the susceptor 102. Since the plurality of the arms extend to the positions under the peripheral portion of the susceptor 102, the arm connecting member 109 does not interrupt between the lower pyrometer 113 and the rear surface of the susceptor 102. "The peripheral portion of the susceptor" herein means "a region outside a central region of the susceptor which has a radius of 80% or more of the susceptor radius". The plurality of support pins 110 disposed at an equal distance from the center of the susceptor 102 allow deflection of the susceptor 102 to be suppressed as appropriate; therefore, the arm connecting member 109 is more preferably a ring member concentric with the susceptor 102. Further, the plurality of arms 108 are connected to be integrated by the arm connecting member 109, which makes the arm connecting member 109 have a stable structure as a base on which the support pins 110 are placed, so that the susceptor 102 itself can be prevented from being inclined when being placed. Although all of the support pins 110 are attached to the arm connecting member 109 in the present invention, any attachment mode can be used as long as similar effects can be achieved. For example, some of the support pins may be attached to some of the tips of the arms 108, the other of the support pins may be attached to the arm connecting member 109 connected to the side surfaces of the tips of the arms 108.

The foregoing descriptions merely illustrate examples of embodiments of the present invention, and various modifications may be made thereto within the scope of the present invention defined by accompanying claims.

EXAMPLES

Example 1

Figure 4:
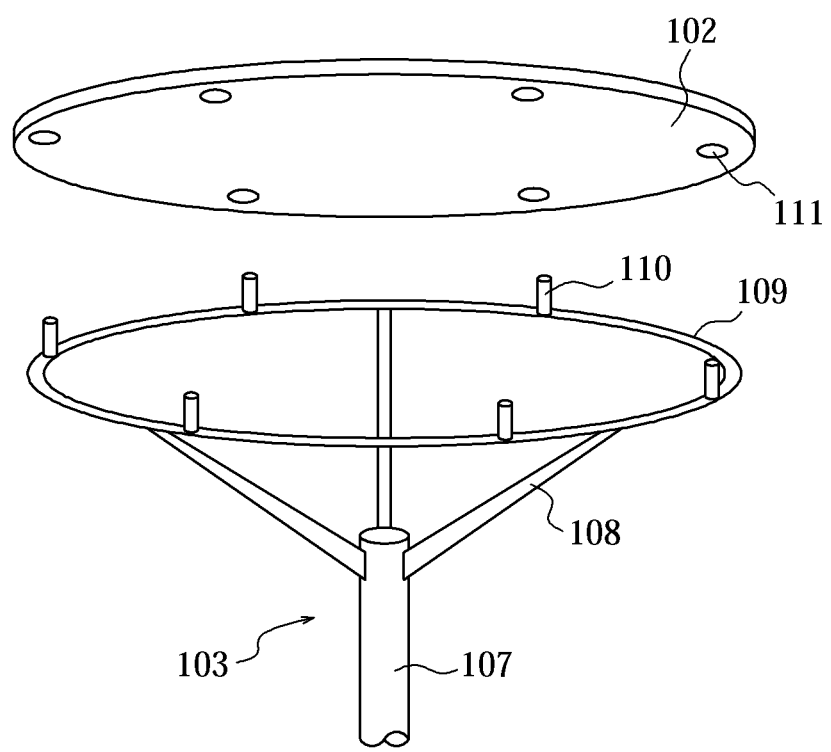
FIG. 4 is a schematic exploded perspective view showing details of a susceptor 102 and the susceptor support shaft 103 shown in FIG. 3 according to the present invention.

An epitaxial growth process was carried out using an epitaxial growth apparatus having a susceptor support shaft made of quartz glass shown in FIG. 4. The susceptor support shaft has a ring member on the tips of three arms radially extending from the top end of a support column coaxial with the center of a susceptor with equal intervals therebetween and has six support pins at equal intervals therebetween on the ring. Specifically, a P-type single crystal silicon wafer having a diameter of 300 mm, a plane direction (100), and a specific resistance of 10 Ω·cm was used, and the susceptor support shaft was rotated at 40 rpm. After performing hydrogen bake for 60 seconds at 1130° C., a reaction gas mixture, produced by diluting $SiHCl_3$ as a silicon source and $B_2H_6$ as a boron dopant source with hydrogen gas, was supplied into the chamber of the epitaxial growth apparatus to grow a P-type epitaxial silicon film having a thickness of about 2 μm and a specific resistance of 15 Ω·cm at a growth temperature of 1130° C. During the growth of the film, the temperatures of the upper surface and the rear surface of the susceptor were detected using an upper pyrometer and a lower pyrometer. The susceptor has a diameter of 360 mm and is made of graphite, and the surface of the susceptor is coated with silicon carbide. Further, the support pins of the susceptor support shaft and the susceptor were in contact with each other at positions 178 mm distant from the center of the susceptor.

Example 2

An epitaxial growth process was carried out using a susceptor support shaft the same as the one used in Example 1 except for that the susceptor support shaft had four support pins on the ring at equal intervals.

Example 3

An epitaxial growth process was carried out using a susceptor support shaft the same as the one used in Example 1 except for that the susceptor support shaft had nine support pins on the ring at equal intervals.

Comparative Example 1

Figure 1:
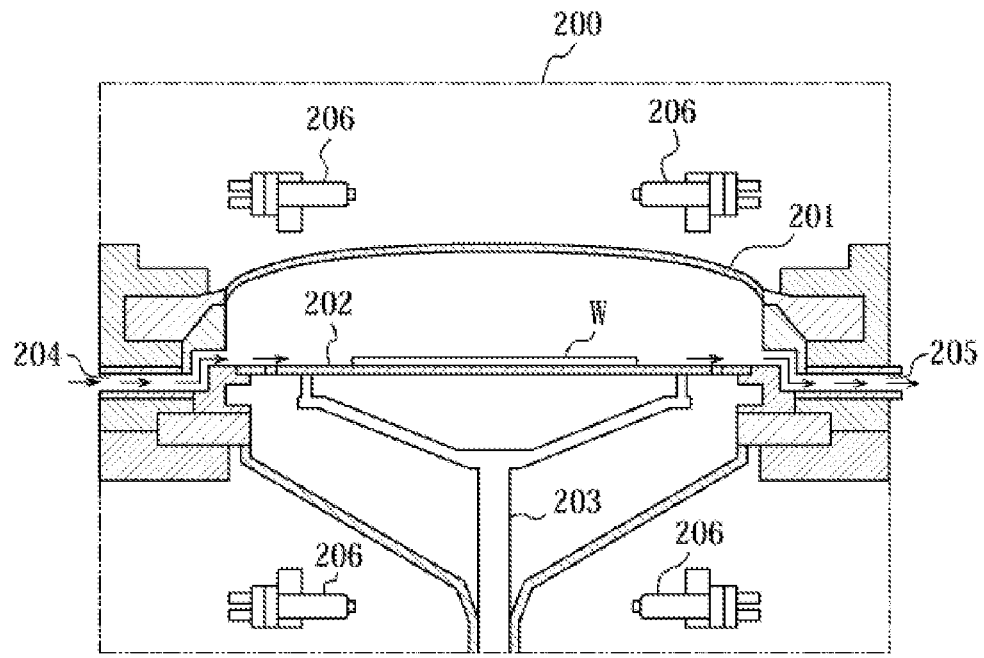
FIG. 1 is a schematic sectional view of a conventional single-wafer epitaxial growth apparatus.
Figure 2:
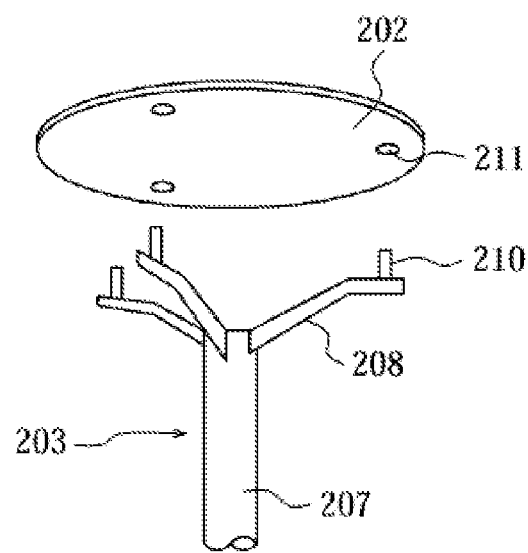
FIG. 2 is a schematic exploded perspective view showing details of a susceptor 202 and a susceptor support shaft 203 shown in FIG. 1.

An epitaxial growth process was carried out using an epitaxial growth apparatus having a susceptor support shaft made of quartz glass shown in FIG. 2. The susceptor support shaft has three arms radially extending from the top end of a support column and three support pins. The other conditions are the same as those in Example 1.

Comparative Example 2

An epitaxial growth process was carried out using a susceptor support shaft the same as the one used in Comparative Example 1 except for that the number of the arms was six and the number of the support pins was six.

(Evaluation 1: Measurement of In-Plane Dopant Concentration Profile)

Figure 5:
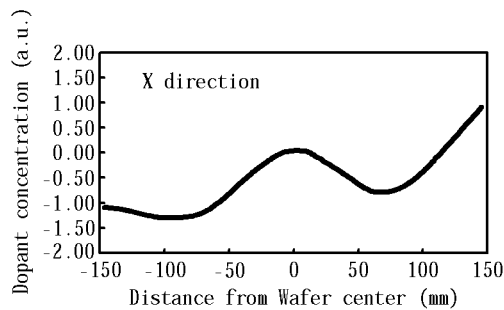
FIGS. 5A and 5B show profiles of resistivity distributions of epitaxial wafers according to Comparative Example 1 and Example 1, respectively.
FIG. 5C is a schematic diagram showing a direction in which the resistivity distributions of the epitaxial wafers are measured.
Figure 5:
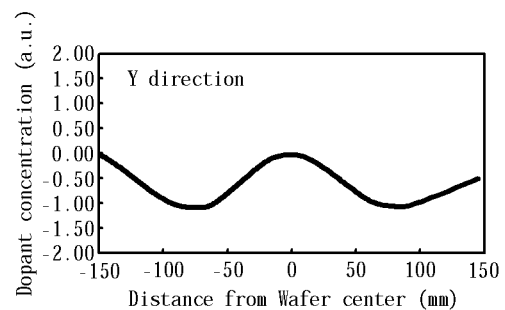
Figure 5:
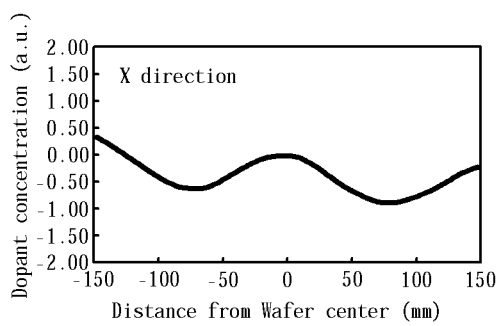
Figure 5:
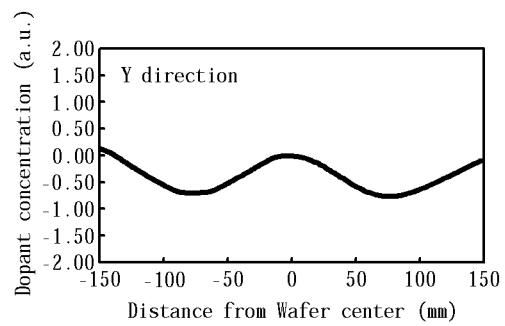
Figure 5:
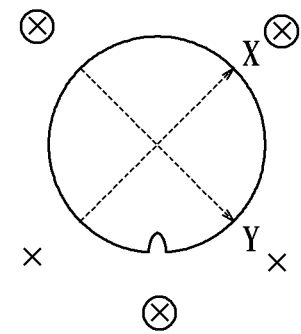

Variations of the dopant concentrations in the diameter direction of the epitaxial wafers of Examples 1 to 3 and Comparative Examples 1 and 2 were measured using an SCP measurement apparatus (QCS-7300RB produced by QC Solutions, Inc). The dopant concentration profiles in Comparative Example 1 and the dopant concentration profiles in Example 1 are shown as representative examples in FIG. 5A and FIG. 5B, respectively. Further, the directions in which the dopant concentrations of the epitaxial wafers were measured in FIGS. 5A and 5B are illustrated in FIG. 5C. "X direction" graphs in FIGS. 5A and 5B on the left side are graphs of measurement in X direction of FIG. 5C. Meanwhile, "Y direction" graphs in FIGS. 5A and 5B on the right side are graphs of measurement in the Y direction of FIG. 5C. Further, in FIG. 5C, mark x represents a position at which the susceptor was supported in Example 1 (FIG. 5B), while mark ○ represents a position at which the susceptor was supported in Comparative Example 1 (FIG. 5A). Each of the diagrams shows the difference from the reference (0.00) corresponding to the dopant concentration of the epitaxial layer in the wafer center portion, that is, "(dopant concentration at region other than wafer center portion−dopant concentration at wafer center portion)/($1\times10^{15}$ atoms/cm$^3$)".

In the case of three-point support in Comparative Example 1, as clear from the X direction graph in FIG. 5A, the dopant concentration is low on the left side of the graph, while the dopant concentration is high on the right side of the graph. Thus, the dopant concentration profile (that is, resistivity distribution) is not uniform on the both sides. The Y direction graph showed a similar tendency. On the other hand, in the case of six-point support in Example 1, as clearly shown in the X direction graph in FIG. 5B, the difference in the dopant concentrations on right and left sides of the graph, is smaller than that in the X direction graph in FIG. 5A. Thus, the dopant concentration profile (resistivity distribution) on both sides is more uniform. The Y direction graph showed a similar tendency.

The results of calculating the non-uniformity of the dopant concentration profiles (resistivity distribution) of the epitaxial wafers obtained in Example 1 to 3 and Comparative Example 1 are shown in FIG. 6. The horizontal axis in FIG. 6 represents the number of supporting points, while the vertical axis represents the "non-uniformity of the dopant concentration profile". The "non-uniformity of the dopant concentration profile" is a value obtained by measuring the dopant concentrations of each epitaxial wafer at a plurality of points (9 points in the epitaxial wafer) in the epitaxial layer surface using the SCP measurement apparatus and calculating "(maximum value−minimum value)/(maximum value+minimum value)×100" based on the measured values.

FIG. 6 shows that the resistivity distributions in Examples 1 to 3 are more uniform than that in Comparative Example 1. The non-uniformity is almost stable particularly when the susceptor is supported at six or more points, and it is found that the number of the supporting points is not necessarily increased excessively. It is preferable to support the susceptor at a minimum of six points.

(Evaluation 2: Temperature Detection by Pyrometers)

Figure 7:
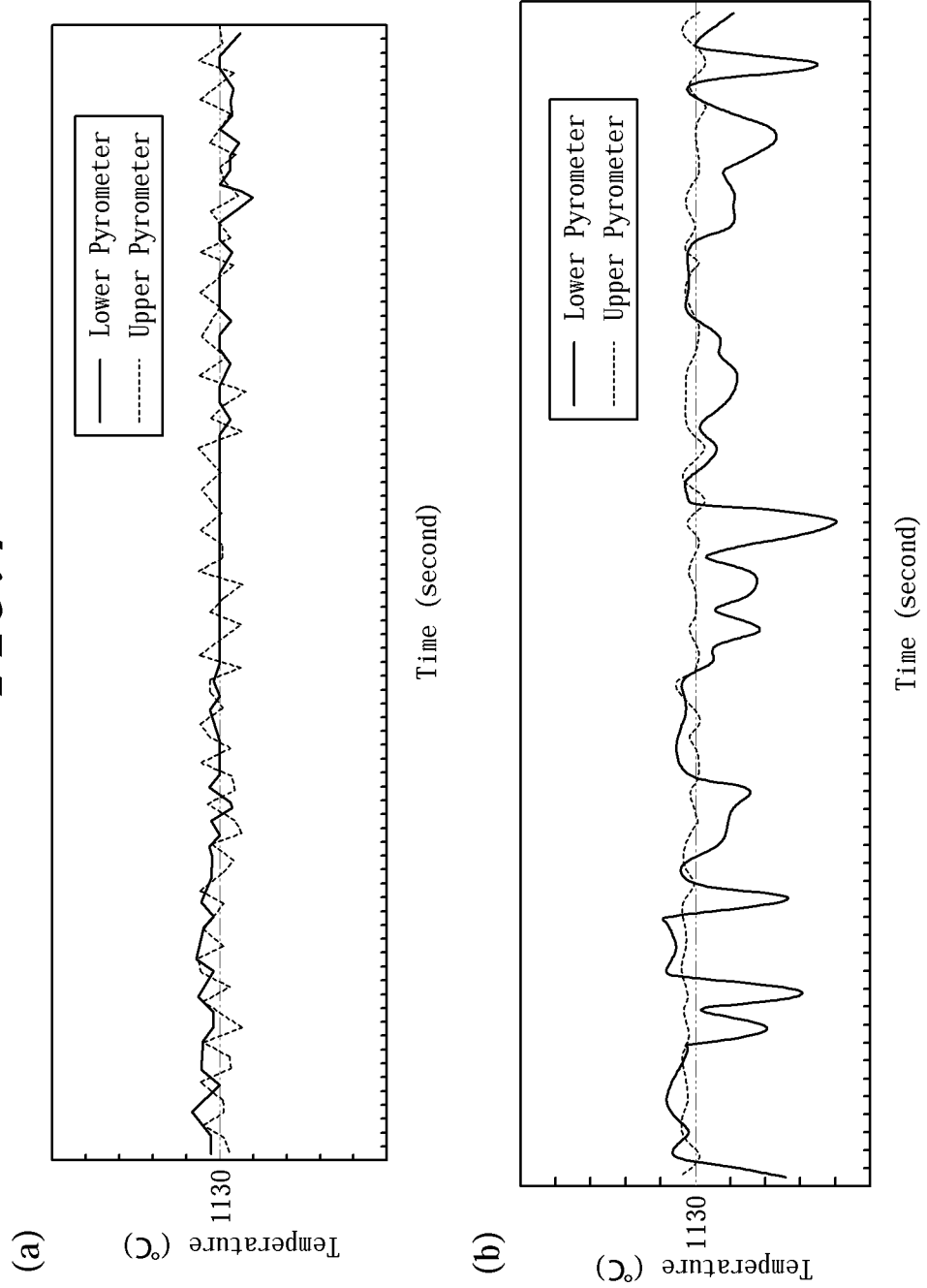
FIGS. 7A and 7B are diagrams showing the temperatures detected by an upper pyrometer and a lower pyrometer over time in epitaxial growth processes of Example 1 and Comparative Example 2, respectively.

The influence of the number of arms on the temperature detection by pyrometers was examined. FIG. 7A shows the change in values of the temperature detected in the epitaxial growth process of Example 1 (three arms, six support pins) using the upper pyrometer and the lower pyrometer (produced by Ircon, Inc). Similarly, FIG. 7B shows the change in values of the temperature detected in the epitaxial growth process of Comparative Example 2 (six arms, six support pins) using the upper pyrometer and the lower pyrometer.

As clearly shown in FIGS. 7A and 7B, in FIG. 7A, where the number of the arms is three, the change in the values of the temperature detected by the lower pyrometer from a target temperature was small, and the fluctuation in the measured temperature (difference between the maximum value and the minimum value) is 3.4° C., which is favorable. On the other hand, in FIG. 7B, where the number of the arms is six, the change in the values of the temperature detected by the lower pyrometer from the target temperature is large, and the fluctuation in the measured temperature is significantly increased to 9.4° C. In addition, epitaxial growth processes were carried out under the same conditions as Example 1 except for that the numbers of arms was changed to four and five. The change in the values of the temperature detected by the lower pyrometer in the epitaxial growth process in each case was examined, and favorable temperature fluctuations of 3.8° C. and 4.1° C. were achieved, respectively. Consequently, the number of arms is preferably reduced to detect the temperature of the rear surface of a susceptor, and five or less arms, especially three arms are preferable.

A susceptor support shaft and an epitaxial growth apparatus of the present invention use at least four support pins for supporting a susceptor at an underneath portion of the susceptor, thereby suppressing in-plane resistance variation of an epitaxial film due to deflection of the susceptor. Meanwhile, the number of arms is smaller than that of support pins, thereby ensuring accuracy in detecting the temperature of the rear surface of the susceptor by a pyrometer and reducing variation in the in-plane temperature. Thus, a high-quality epitaxial wafer with uniform in-plane resistivity distribution can be produced.

REFERENCE NUMERALS

100: Epitaxial growth apparatus
101: Chamber
102: Susceptor
103: Susceptor support shaft
104: Supply port
105: Exhaust port
106: Heating source
107: Support column
108: Arm
109: Arm connecting member
110: Support pin
111: Recessed portion
112: Upper pyrometer
113: Lower pyrometer

What is claimed is:

1. A susceptor support shaft, supporting a susceptor at an underneath portion of the susceptor in an epitaxial growth apparatus for forming an epitaxial film on a surface of a semiconductor wafer placed on the susceptor, the susceptor support shaft comprising:
 a support column located substantially coaxial with a center of the susceptor;
 a plurality of arms extended radially from the support column to positions under a peripheral portion of the susceptor;
 an arm connecting member connecting tips of the arms next to each other, the arm connecting member being a ring member concentric with the susceptor and outside of the central region of the susceptor which has a radius of 80% or more of the susceptor radius; and
 n support pins, where n is a natural number of four or more, provided on the arm connecting member, thereby directly supporting the susceptor by each tip of the support pins,
 wherein the arm connecting member is separated from the susceptor, and
 wherein the number of the arms is n−1 or less.

2. The susceptor support shaft according to claim 1, wherein the number of the arms is three or more and five or less.

3. The susceptor support shaft according to claim 1, wherein the number of the support pins is nine or less.

4. The susceptor support shaft according to claim 1, wherein the number of the arms is three, and the number of the support pins is six.

5. An epitaxial growth apparatus for forming an epitaxial film on a surface of a semiconductor wafer placed inside a chamber, comprising a susceptor on which the semiconductor wafer is placed inside the chamber, and the susceptor support shaft according to claim 1.

* * * * *